United States Patent [19]

Matsubara

[11] Patent Number: 6,040,240
[45] Date of Patent: Mar. 21, 2000

[54] METHOD FOR FORMING INTERCONNECTION STRUCTURE

[75] Inventor: Yoshihisa Matsubara, Tokyo, Japan

[73] Assignee: NEC Corporation, Tokyo, Japan

[21] Appl. No.: 09/300,439

[22] Filed: Apr. 28, 1999

[30] Foreign Application Priority Data

Apr. 30, 1998 [JP] Japan .................................. 10-120494

[51] Int. Cl.[7] .................................................. H01L 21/44
[52] U.S. Cl. ......................... 438/618; 438/629; 438/633; 438/660; 438/687
[58] Field of Search ..................................... 438/618, 622, 438/629, 633, 660, 687; 257/762

[56] References Cited

U.S. PATENT DOCUMENTS

| | | | |
|---|---|---|---|
| 5,354,712 | 10/1994 | Ho et al. | 438/687 |
| 5,592,024 | 1/1997 | Aoyama et al. | 257/751 |
| 5,763,953 | 6/1998 | Iljima et al. | 257/762 |
| 5,913,147 | 6/1999 | Dubin et al. | 438/687 |
| 5,959,358 | 9/1999 | Lanford et al. | 257/762 |
| 5,990,005 | 11/1999 | Hirose et al. | 438/660 |

OTHER PUBLICATIONS

Braeckelman, G., et al., "Deposition of barrier layer and CVD copper under no exposed wafer conditions: adhesion performance and process integration," Materials for Advanced Metallization, Mar. 16–19, 1997, pp. 27–29.

Ueno, K., et al., "Uniform (111) Textured Cu CVD on Vacuum Anneated Cu Seed Layer," Interconnect Technology Conference, Jun. 1–3, 1998, Proceedings of the IEEE International, pp. 119–121.

*Primary Examiner*—T. N. Quach
*Attorney, Agent, or Firm*—Sughrue, Mion, Zinn, Macpeak & Seas, PLLC

[57] ABSTRACT

Disclosed herein is a method for forming a copper interconnect in which a substrate having the copper interconnect is exposed to atmosphere after the substrate is cooled to a temperature below 160° C. under a non-oxidizable atmosphere. The exposure of the substrate to a relatively high temperature conventionally makes an electric resistance between interconnects on the substrate higher to prevent high integration. In accordance with the present invention, the above electric resistance can be reduced to smoothly realize the high integration because of the exposure of the substrate to a relatively low temperature.

9 Claims, 7 Drawing Sheets

METHOD FOR FORMING INTERCONNECTION STRUCTURE

BACKGROUND OF THE INVENTION (a) Field of the Invention

The present invention relates to a method for forming a Cu (copper) interconnection structure for a semiconductor device on a substrate, and more in particular to a method for forming a minute multilevel interconnection structure of copper having a low electric resistance.

(b) Description of the Related Art

A conventional and standard process of forming an interconnection structure in a semiconductor device includes forming a first level interconnect by processing a first level interconnect layer made of Al or an Al alloy by means of photolithography and etching, depositing an interlayer dielectric film on the first level interconnect, flattening the first level interconnect, forming a via hole, filling the via hole with tungsten, depositing a second level interconnect layer made of Al or an Al alloy and processing the second level interconnect layer by means of photolithography and etching.

In the conventional interconnection process, the process becomes complicated with the progress of the multi-level interconnection structure because of the increase of the number of steps of the photolithography and the etching. Further, the filling of a space between interconnects without forming a void is difficult because the coverage of the interlevel dielectric film becomes severe with the miniaturization of the pitch of the interconnects.

In the generation in which the line width is between 0.18 and 0.20 micronmeter, the line pitch becomes narrow and the increase of the capacitance between the interconnects is not negligible so that the performance deterioration of LSI may be caused due to the signal/propagation delay. As one possible way of preventing this deterioration, a copper interconnect having a lower electric resistance compared with the Al or the Al alloy attracts attention. However, the etching of copper is difficult to be controlled, and as a result, the processing of copper to make an interconnect in accordance with a process similar to that employed for making the conventional Al interconnect is hardly practicable.

In order to overcome this disadvantage, a method for forming a multi-level interconnection structure having a copper interconnect in accordance with the Damasin process is attracting attention.

The above method for forming the multi-level structure having the copper interconnect will be described referring to FIG. 1.

At first, as shown in FIG. 1A, a $SiO_2$ film 14 made of BPSG (boro-phospho silicate glass) is formed on a silicon substrate 12, and then a via-hole (not shown) is formed for exposing a diffused region (source/drain region) in the silicon substrate 12 to form a conductive plug (not shown) such as a tungsten plug in electric contact with the diffused region of the silicon substrate 12.

Then, as shown in FIG. 1B, a plasma $SiO_2$ film 16 is formed on the $SiO_2$ film 14 employing a plasma CVD (chemical vapor deposition) method. Reaction gases such as silan ($SiH_4$) and $O_2$ are employed for forming the plasma $SiO_2$ film 16.

After the formation of a photoresist film 18 on the plasma $SiO_2$ film 16, a mask to which an interconnect pattern is transferred by patterning is formed by employing photolithography and etching. Then, by employing the mask 18 as an etching mask, etching is performed to form an interconnect trench 20 which penetrates the plasma $SiO_2$ film 16 to expose a conductive plug (not shown) formed in the $SiO_2$ film 14 as shown in FIG. 1C.

The mask 18 is removed by oxygen plasma ashing. Then, as shown in FIG. 1D, a TiN film 22 is deposited as a barrier layer on the whole surface of the substrate, and further a copper layer 24 is formed on the TiN film 22 to fill the interconnect trench 20 with the copper.

The copper layer 24 and the TiN film 22 are polished by means of CMP (chemical mechanical polishing) until the plasma $SiO_2$ film 16 is exposed, and as shown in FIG. 1E, the first level copper interconnect (copper layer) 24 is formed which electrically contacts with the conductive plug (not shown) at the bottom and has an exposed top surface and side surfaces contacting with the $SiO_2$ film 16.

Then, a $SiO_2$ film 26 made of such as BPSG acting as an interlevel dielectric film is formed on the wafer surface, and a photoresist film is formed thereon followed by patterning thereof to obtain a mask 28. As shown in FIG. 1F, the $SiO_2$ film 26 is etched using the above mask 28 as an etching mask to form a via-hole 30 for exposing the first level copper interconnect 24.

In order to reduce a contact resistance between a tungsten plug to be embedded in the via-hole 30 and the first level copper interconnect 24, the wafer is washed for cleaning the bottom of the via-hole 30 or the surface of the first level copper interconnect 24.

After the washing, the substrate is thermally treated or receives a baking treatment at a temperature range between 300 and 700° C. to remove liquid containing moisture entering into the interlayer dielectric film from the substrate during the washing so as to elevate an electromigration durability by promoting satisfactory crystallization of the first level copper interconnect 24. During the thermal treatment, the first level copper interconnect 24 is exposed through the via-hole 30.

Then, as shown in FIG. 1G, a TiN film 32 acting as a barrier layer is formed on the whole surface of the substrate, and a tungsten layer 34 is formed on the TiN film 32.

The TiN film 32 and the tungsten layer 34 are then polished by means of CMP until the plasma $SiO_2$ film 26 is exposed, and as shown in FIG. 1H, the tungsten plug 34 embedded in the via-hole 30 is formed.

Further, a plasma $SiO_2$ film 38 is formed on the plasma $SiO_2$ film 26, and an interconnect trench is formed similarly to the formation of the first level copper interconnect 24. Then, a TiN film 40 and a copper layer 42 are formed, and this laminate layer is polished by CMP to make a second level copper interconnect as shown in FIG. 1I.

A thermal treatment is conducted thereon under a hydrogen atmosphere at a temperature of about 400° C. (hydrogen annealing) to promote the proper crystallization of the first level copper interconnect 24 and the second level copper interconnect 42. As a result, the crystal grains become larger to elevate the electromigration durability.

In the conventional method of forming the copper interconnect in accordance with the Damasin process, the electric resistances of the first level copper interconnect and the second level copper interconnect and those of contact portions between the tungsten plug and the first level copper interconnect and between the former and the second level copper interconnect inevitably increase.

This is a restriction for miniaturization of an interconnect and realization of a multi-level structure, and is a bar to high integration of a semiconductor device.

Although, in the above description, a problem about an electric resistance increase has been pointed out by taking the copper interconnect formation by means of the Damasin process as an example, this problem arises not only in the Damasin process but also in a conventional process consisting of depositing a copper layer, forming a copper interconnect by means of patterning, embedding an dielectric film and opening a via-hole.

SUMMARY OF THE INVENTION

In view of the foregoing, an object of the present invention is to provide a method for forming a multilevel copper interconnection structure having a low electric resistance.

The present invention provides a method for forming a copper interconnect comprising the steps of: forming the exposed copper interconnect on a substrate, thermally treating the substrate in a thermal treatment furnace under a non-oxidizable atmosphere, dropping a temperature of the copper interconnect below 160° C. under the non-oxidizable atmosphere and exposing the substrate thermally treated to atmosphere for cooling the substrate.

In accordance with the method for forming the interconnection structure of the present invention, the copper interconnect having a low electric resistance can be realized. The high integration and the miniaturization of a semiconductor device can be further promoted by applying this method for formation of the copper interconnect structure.

The above and other objects, features and advantages of the present invention will be more apparent from the following description, referring to the accompanying drawings.

DESCRIPTION OF PREFERRED EMBODIMENTS

The present inventors have found the following by researching reasons of elevating an electric resistance of a copper interconnect when a copper multi-level interconnection structure is formed by the conventional Damasin process.

In the conventional copper interconnect formation process, as mentioned earlier, the surfaces of the via-hole and of the first level copper interconnect 24 are cleaned by washing the substrate when the tungsten plug is formed. Then, in order to exclude the moisture entering into the $SiO_2$ film 16, the substrate is thermally treated in the thermal treatment furnace. After the substrate is taken out from the furnace, the substrate is conveyed to an apparatus for forming a tungsten blanket in order to embed the tungsten plug in the via-hole.

The present inventors have found during the researches that the electric resistance of the first level copper interconnect and of the electric connection with the tungsten plug elevate because the surface layer of the copper interconnect exposed through the via-hole is oxidized to be converted into $Cu_2O$ or $CuO$ at the time of the exposure of the substrate to atmosphere after it is taken out from the furnace and that the electric resistance elevates proportional to the thickness of the Cu oxide film formed on the first level copper interconnect.

This phenomenon also occurs when the second level copper interconnect is formed on the substrate and the substrate is taken out from the furnace after the hydrogen annealing.

Figure 2:
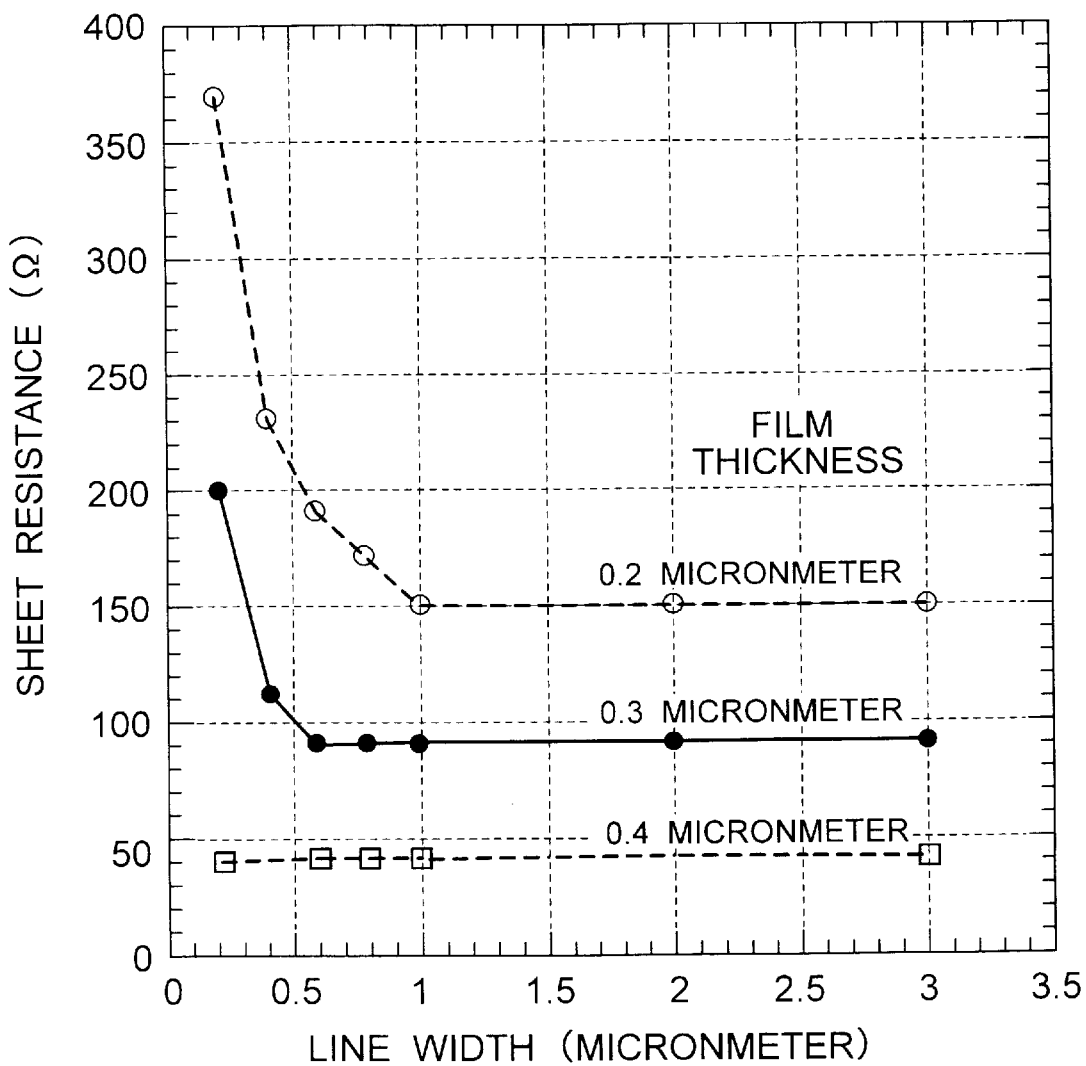
FIG. 2 is a graph showing a dependency of a sheet resistance to an interconnect width.

The oxidation proceeds from the surface of the interconnect layer when the substrate is exposed to atmosphere. FIG. 2 is a graph showing a dependency of a sheet resistance to a line width. As apparent from this graph, the interconnect resistance rapidly increases with the thinning of the line width and of the film thickness. This is because the relative thickness of the surface oxidized layer to the total thickness or to the total interconnect volume increases with the thinning of the line width and of the film thickness. When the film thickness is 300 nm (0.3 micronmeter) or less, the volume ratio of the surface oxidized layer becomes 30% or more and the interconnect resistance increases which is not negligible.

Figure 3:
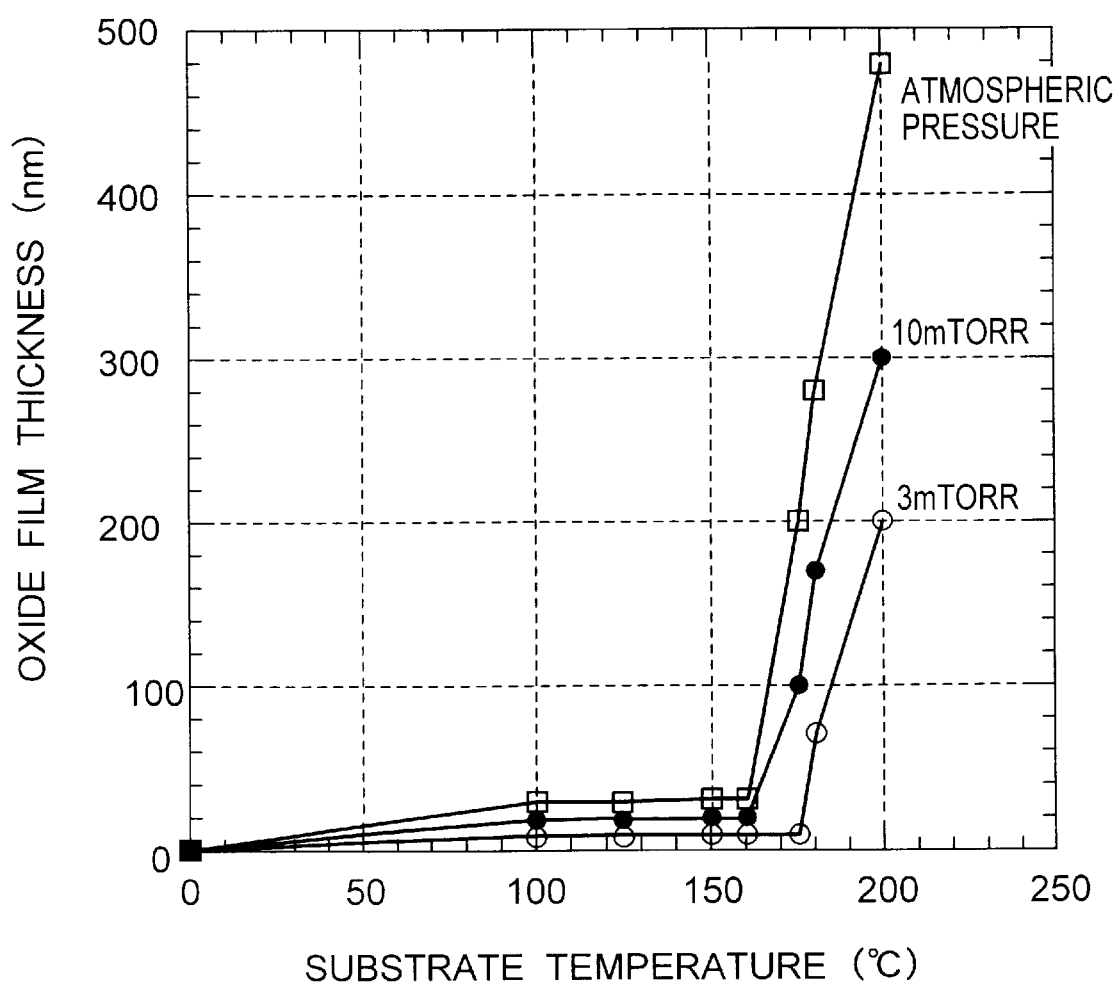
FIG. 3 is a graph showing a relation between a thickness of a cooper oxidized film and a substrate temperature.

The present inventors have investigated a relation between the thickness of the copper oxidized film formed in the copper interconnect and the substrate temperature exposed to atmosphere employing, as a parameter, air pressures in the atmosphere in which the substrate is left when the substrate is cooled, to obtain a result shown in FIG. 3 which is a graph showing the relation mentioned above.

The graph of FIG. 3 shows that when the substrate temperature exceeds 160° C., the film thickness of the copper oxidized film increases so that the value of the electric resistance of the copper interconnect rapidly increases. The graph naturally shows that the film thickness decreases with the lowering of the air pressure at the same temperature.

Figure 4:
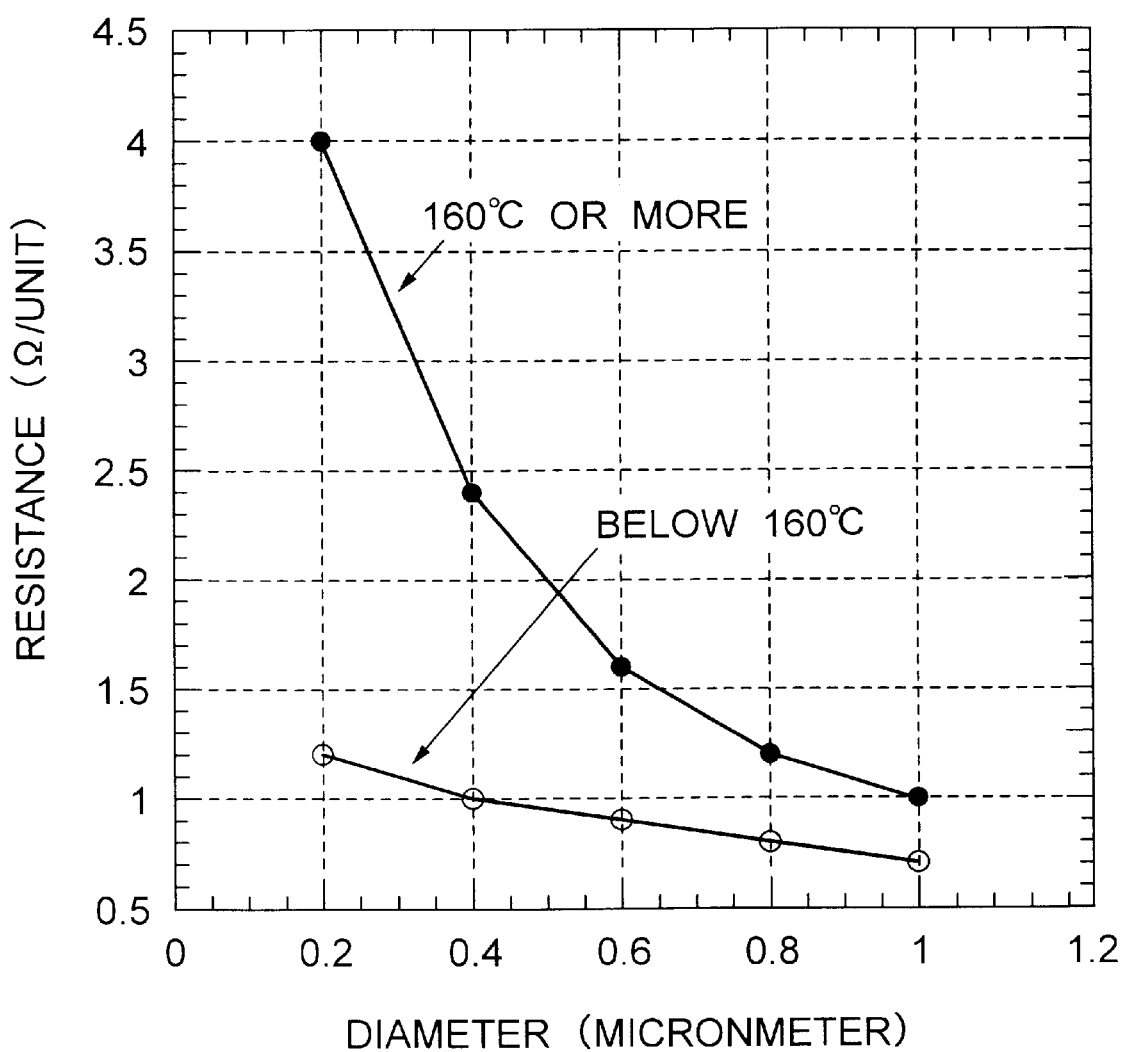
FIG. 4 is a graph showing a relation between a diameter of a conductive plug and an electric resistance.

A relation between a conductive plug diameter and an electric resistance of a copper interconnect in contact with the conductive plug at its top and bottom surfaces when the substrate temperature exceeds 160° C. and when it is below 160° C. is investigated to obtain results shown in a graph of FIG. 4.

This graph shows that the value of the electric resistance of the copper interconnects placing the conductive plug therebetween rapidly increases with the decrease of the diameter of the conductive plug when the substrate temperature exceeds 160° C. In the other words, the electric resistance of the surface layer of the copper interconnect becomes dominant with the decrease of the diameter of the conductive plug to elevate the electric resistance between the copper interconnects.

The present inventors have found that the substrate temperature is required to be below 160° C. when the substrate is exposed to atmosphere after the thermal treatment.

The way of depositing the copper layer in the copper interconnect formation step is not restricted, and, for example, such a known method as a sputtering method, a plating method and a chemical vapor deposition method, and a combination thereof can be employed. The copper in the copper layer desirably has a purity of almost 100%.

A method for cooling the copper interconnect below 160° C. is not restricted provided that no oxidation of the copper takes place and the cooling can be conducted under a non-oxidizable atmosphere. For example, a spontaneous cooling in which the substrate is left standing under vacuum or an inert gas atmosphere, or a forced cooling in which a cooled inert gas is blown to the substrate under an inert gas atmosphere can be conducted.

The thermal treatment temperature in the thermal treatment step is determined depending on a purpose of the thermal treatment. The non-oxidizable atmosphere means a reduction atmosphere such as a hydrogen atmosphere and an inert gas atmosphere such as an argon atmosphere. The non-oxidizable atmosphere at the time of cooling the substrate is not necessarily the same as that of the thermal treatment step, and for example, a vacuum atmosphere and a nitrogen atmosphere can be employed unless copper is oxidized.

The method for forming the interconnect in accordance with the present invention can be employed regardless of the way of forming an interconnect as far as the copper interconnect is formed. For example, the method of the invention is applicable to a normal method of forming a copper interconnect in which the copper interconnect is formed by processing the copper layer already prepared by means of photolithography and etching and to a Damasin process or a dual Damasin process.

The present invention is suitably applied to the formation of a minute copper interconnect having a thickness of 500 nm or less and a width of 0.5 micronmeter or less formed on a substrate.

In the copper depositing step in accordance with a preferred Embodiment of the present invention, before the copper depositing, a metal layer other than copper is formed as an adherence layer or a barrier layer, and the CMP treatment is conducted on the copper layer and then on the metal layer other than copper in the CMP step.

As a metal for forming the metal layer other than copper, a metal or a metal nitride such as Ta, TaN, TiN and WN can be employed.

An Embodiment of the present invention will next be described in detail with reference to the drawings.

Figure 5:
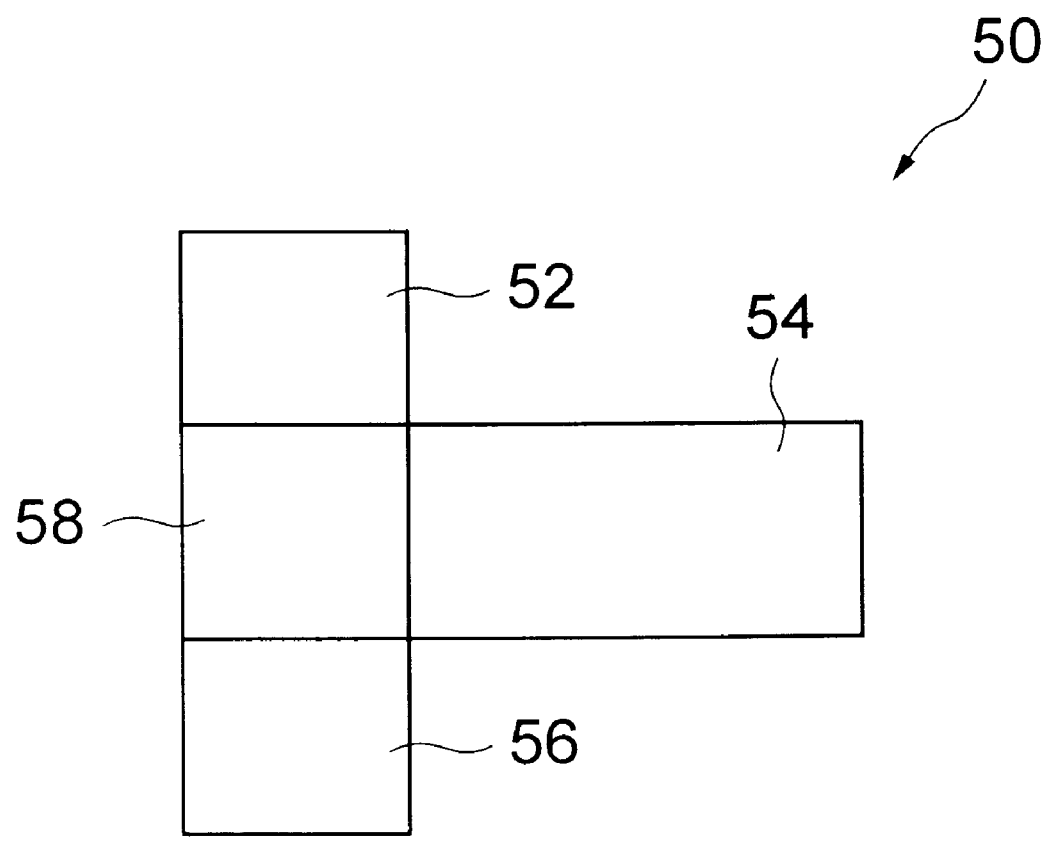
FIG. 5 is a schematic plan view showing a thermal treatment apparatus.

This Embodiment is one example in which the method of the present invention is applied to a case wherein a two-layered interconnection structure having a thickness of 2000 to 3000 Å is formed in accordance with the Damasin process. FIG. 5 is a schematic illustration of an apparatus for conducting a thermal treatment for forming an interconnection structure of the Embodiment.

A thermal treatment apparatus 50 shown in FIG. 5 consists of a load locking chamber 52 for carrying in a substrate, a ramp annealing furnace or an RTA (Rapid Thermal Annealing) furnace 54 having the same atmosphere as that of the chamber 52 or a vacuum atmosphere and an unload locking chamber 56 for carrying out the substrate having a non-oxidizable atmosphere under vacuum. In FIG. 5, a symbol 58 designates a front chamber located in front of the thermal treatment furnace 54 which includes a robot for handling the substrate.

A method for forming an interconnection structure in accordance with the present Embodiment will be described referring to FIG. 1.

The method of this Embodiment is the same as the conventional method for forming an interconnection structure except that before the substrate is exposed to atmosphere, a copper interconnect is cooled to a temperature of 160° C. or less in the unload locking chamber 56 when the substrate thermally treated in the thermal treatment furnace 54 is taken out from the furnace 54 in order to shift from the thermal treatment step to a next step, for example, to a copper depositing step and that copper is employed as a metal plug.

Figure 1A:
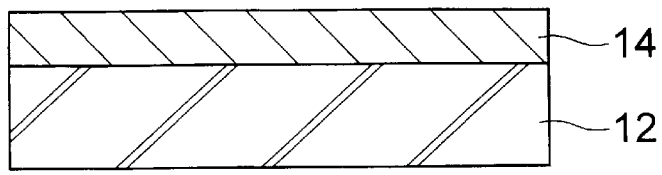
FIGS. 1A to 1I are sectional views of a substrate showing the respective steps of forming a two-layered copper interconnect structure in accordance with a inventional method and a method of the present invention.

At first, as shown in FIG. 1A, an $SiO_2$ film 14 made of BPSG (boro-phospho silicate glass) is formed on a silicon substrate 12, and then a via-hole (not shown) is opened for exposing a diffusion region (source/drain region) in the silicon substrate 12 to make a conductive plug (not shown) such as a tungsten plug for conducting the diffusion region of the silicon substrate 12.

Figure 1B:
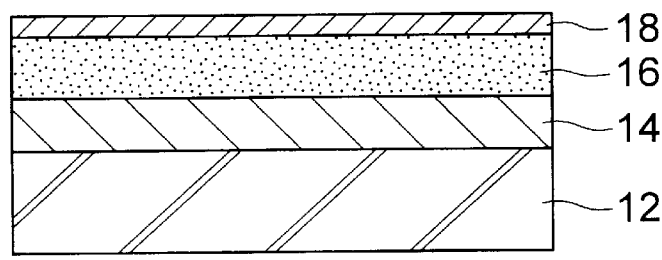

Then, as shown in FIG. 1B, a plasma $SiO_2$ film 16 Csm is formed on the $SiO_2$ film 14 employing a plasma CVD (chemical vapor deposition) method. A reaction gas such as silan ($SiH_4$) and $O_2$ is employed for forming the plasma $SiO_2$ film 16.

Figure 1C:
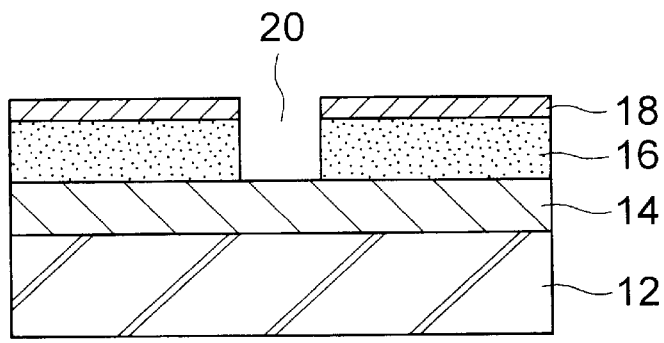

After the formation of a photoresist film 18 on the plasma $SiO_2$ film 16, a mask to which an interconnect pattern is transferred by means of the patterning by employing photolithography and etching is formed. Then, etching is performed by employing the mask 18 acting as an etching mask to form an interconnect trench 20 which penetrates the plasma $SiO_2$ film 16 and has an upward opening to expose a conductive plug (not shown) as shown in FIG. 1C.

Figure 1D:
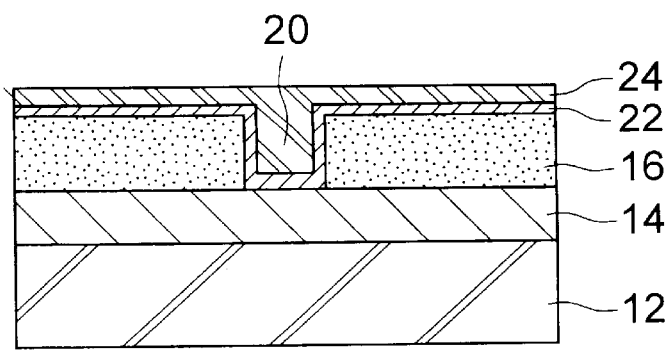

The mask 18 is removed by oxygen plasma ashing. Then, as shown in FIG. 1D, a TiN film 22 acting as a barrier surface is built on the whole surface of the substrate, and further a copper layer 24 is formed on the TiN film 22 to fill the interconnect trench 20 therewith.

Figure 1E:
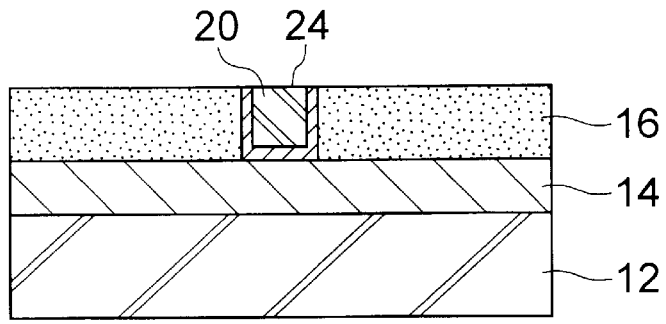

The copper layer 24 and the TiN film 22 are polished by means of CMP (chemical mechanical polishing) until the plasma $SiO_2$ film 16 is exposed, and as shown in FIG. 1E, the first level copper interconnect 24 is formed which is in contact with the conductive plug (not shown) at the bottom and has an exposed top surface and side surfaces in contact with the $SiO_2$ film 16.

Figure 1F:
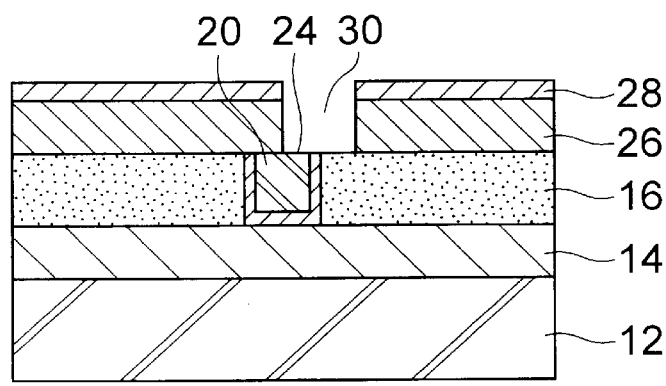

Then, an $SiO_2$ film 26 such as BPSG acting as an interlayer dielectric film is formed on the substrate, and a photoresist film is formed thereon to make a mask 28 by patterning. As shown in FIG. 1F, the $SiO_2$ film 26 is etched employing a plasma etching process to make a via-hole 30 for exposing the first level copper interconnect 24.

In order to reduce a contact resistance between a copper plug embedded in the via-hole 30 and the first level copper interconnect 24, the substrate is washed to clean the bottom of the via-hole 30 or the surface of the first level copper interconnect 24.

After the washing, the substrate is thermally treated or receives a baking treatment at a temperature range between 300 and 700° C. to remove liquid containing moisture entering into the interlayer dielectric film during the washing and to elevate an electromigration durability.

In the thermal treatment step, the substrate is conveyed to the thermal treatment furnace 54 through the load locking chamber 52 of the thermal treatment apparatus 50. The substrate is thermally treated in the thermal treatment furnace 54 at a specified temperature between 300 and 700° C. for 20 min. The substrate is then spontaneously cooled until its temperature drops below 160° C. in the unload locking chamber 56. During this thermal treatment, the first level copper interconnect 24 is exposed through the via-hole 30.

Figure 1G:
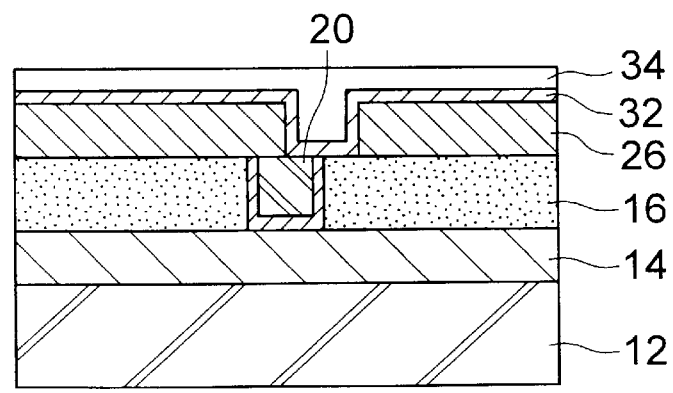

Then, as shown in FIG. 1G, a TiN film 32 is formed acting as a barrier layer on the whole surface of the substrate, and a tungsten layer 34 is formed on the TiN film 32.

Figure 1H:
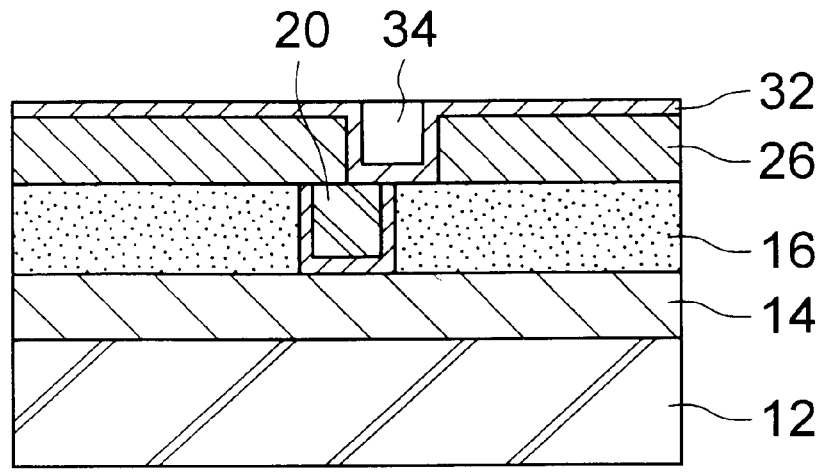
Figure 1:
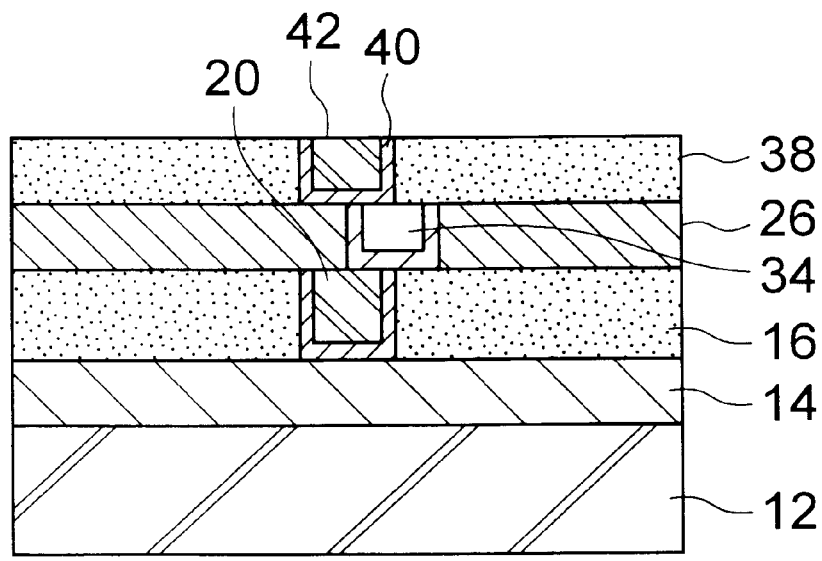

The TiN film 32 and the copper layer 34 are polished by means of CMP until the plasma $SiO_2$ film 26 is exposed, and as shown in FIG. 1H, the copper plug 34 is formed which is embedded in the via-hole 30.

Further, after a plasma SiO$_2$ film 38 is formed on the plasma SiO$_2$ film 26, an interconnect trench is formed similarly to the formation of the first level copper interconnect 24, and then the substrate having the interconnect trench is washed. After the substrate is thermally treated, it is spontaneously cooled in the unload locking chamber 56 until its temperature drops below 160° C. as mentioned above. During this treatment, the copper plug 34 is exposed through the interconnect trench.

Then, a TiN film 40 and a copper layer 42 are formed and polished by CMP to make a second level copper interconnect 42 as shown in FIG. 1I.

A thermal treatment is conducted thereon under a hydrogen atmosphere at a temperature of about 400° C. (hydrogen annealing) to promote the proper crystallization of the first level copper interconnect 24 and the second level copper interconnect 42. As a result, the crystal grains become larger to elevate the electromigration durability.

The hydrogen annealing may be performed after a protective layer such as an dielectric film is formed on the substrate containing the second level opper interconnect 42.

In the hydrogen annealing step, the substrate is at first conveyed to the thermal treatment furnace 54 through the load locking chamber 52 of the thermal treatment apparatus 50. The substrate is thermally treated in the thermal treatment furnace 54 at 400° C. for 20 min. Then, the substrate is spontaneously cooled in the unload locking chamber 56 until its temperature drops below 160° C. During this treatment, all the second level copper interconnect 42 is exposed.

This thermal treatment technique of exposing the substrate to atmosphere at a relatively low temperature can be apparently applied to a copper interconnect formation process in which etching of an interconnect layer and opening of a via-hole are simultaneously conducted because copper is exposed to a surface also in the latter process.

Since the above embodiments are described only for examples, the present invention is not limited to the above embodiments and various modifications or alternations can be easily made therefrom by those skilled in the art without departing from the scope of the present invention.

What is claimed is:

1. A method for forming an interconnection structure the steps of: forming an exposed copper interconnect overlying on a substrate to form a wafer, thermally treating the wafer in a thermal treatment furnace under a non-oxidizable atmosphere, dropping a temperature of the copper interconnect below 160° C. under the non-oxidizable atmosphere and exposing the wafer thermally treated to atmosphere for cooling the wafer.

2. The method as defined in claim 1, wherein the copper interconnect overlying the substrate has a line thickness of 500 nm or less and a line width of 0.5 micronmeter or less.

3. The method as defined in claim 1, wherein the copper interconnect forming step further comprises the steps of:
   a first level trench forming step of forming a first level dielectric film on the substrate and transferring an interconnect pattern on the first level dielectric film to form a first level interconnect trench having an upward opening on the first level dielectric film,
   a first level copper depositing step of depositing copper on the whole surface of the substrate to embed the copper in the first level interconnect trench in addition to form a first level copper, and
   a first level chemical mechanical polishing step of chemically and mechanically polishing the first level copper layer built on the substrate until the first level dielectric film is exposed to form a fist copper interconnect having a top exposed surface and both side surfaces embedded in the first level dielectric film, and and further comprises, before the step of the thermal treatment, the steps of:
   a first level opening step of forming a first level interlayer dielectric film on the substrate and transferring a via-hole pattern on the first level interlayer dielectric film to form, through the interlayer dielectric film, a first level via-hole having an upward opening and exposing the first level copper interconnect at its bottom, and
   a first level cleaning step of cleaning the first level via-hole by washing the substrate.

4. The method as defined in claim 3, wherein the method further comprises, after the first level cleaning step, the steps of:
   a second level copper depositing step of depositing copper on the whole surface of the substrate to form a second level copper layer and to embed the via-hole with the copper,
   a second level CMP step of polishing the second level copper layer on the substrate by means of the CMP treatment to expose the first level interlayer dielectric film and forming a copper plug having a top exposed surface, that penetrates the first level interlayer film and is in contact with the first level copper interconnect at the bottom,
   a second level trench forming step of forming a second level dielectric film on the substrate and transferring an interconnect pattern on the second level dielectric film to form, on the first level dielectric film, a second level interconnect trench having an upward opening and exposing the copper plug at the bottom,
   a second level cleaning step of cleaning the second level interconnect trench by washing the substrate, and
   a step of thermally treating the substrate having the exposed copper plug through the second level interconnect trench in which the substrate is exposed to the atmosphere after the copper interconnect is cooled to a temperature below 160° C. under the non-oxidizable atmosphere.

5. The method as defined in claim 4, wherein the method further comprises, after the step of thermally treating of claim 4, the steps of:
   a third level copper depositing step of depositing copper on the whole surface of the substrate to embed the second level interconnect trench with the copper in addition to form a third level copper layer,
   a third level CMP step of polishing the third level copper layer on the substrate by means of the CMP treatment to expose the second level dielectric film and forming a second level copper interconnect having a top exposed surface and both side surfaces embedded in the second level dielectric film,
   a second level opening step of forming a second level interlayer dielectric film on the substrate and transferring a via-hole pattern on the second level interlayer dielectric film to form a second level via-hole having an upward opening and exposing the second level copper interconnect at the bottom through the second level interlayer dielectric film,
   a third level cleaning step of cleaning the second level via-hole by washing the substrate, and a step of thermally treating the substrate having the exposed second level copper interconnect through the second level via-hole in which the substrate is exposed to the atmosphere after the copper interconnect is cooled to a temperature below 160° C. under the non-oxidizable atmosphere.

6. The method as defined in claim 3, wherein the method further comprises the steps of:

forming a third level dielectric film having a film thickness obtained by adding those of the first or the second level dielectric film and of the first or the second level interlayer dielectric film and transferring an interconnect pattern thereon to form third level interconnect trench having an upward opening in the third level dielectric film, forming a via-hole through the third level dielectric film having an upward opening and exposing the lower layer interconnect at the bottom by transferring a via-hole pattern to the third level dielectric film, depositing copper on the whole surface of the substrate to simultaneously embed the interconnect trench and the via-hole with the copper in addition to form a fourth level copper layer, polishing the fourth level copper layer on the substrate by means of the CMP treatment to expose the third level dielectric film and forming a fourth level copper interconnect and a copper plug having a top exposed surface and both side surfaces embedded in the third level dielectric film, and thermally treating the substrate having the exposed fourth level copper interconnect in which the substrate is exposed to the atmosphere after the copper interconnect is cooled to a temperature below 160° C. under the non-oxidizable atmosphere.

7. The method as defined in claim 3, wherein the copper interconnect formation steps are repeated to form a specified number of the copper interconnect layers, and the substrate is exposed to the atmosphere after the copper interconnect is cooled to a temperature below 160° C. under the non-oxidizable atmosphere in the thermal treatment of the uppermost copper interconnect.

8. The method as defined in claim 3, wherein a metal layer other than copper acting as an adherence layer or a barrier layer is formed before the copper depositing, and the CMP treatment is conducted at first to the copper layer and then to the metal layer other than copper in the CMP step.

9. The method as defined in claim 1, wherein the substrate thermally treated in the thermal treatment furnace is cooled to a temperature below 160° C. in an unload locking chamber by employing a thermal treatment apparatus equipped with the thermal treatment furnace for conducting the thermal treatment of the substrate and the unload locking chamber for the substrate maintained in a non-oxidizable atmosphere.

* * * * *

UNITED STATES PATENT AND TRADEMARK OFFICE
CERTIFICATE OF CORRECTION

PATENT NO.: 6,040,240
DATED: March 21, 2000
INVENTOR(S): Yoshihisa MATSUBARA

It is certified that error(s) appears in the above-identified patent and that said Letters Patent is hereby corrected as shown below:

Column 3, line 37 delete "inventional" insert --conventional--
      line 42 delete "cooper" insert --copper--

Signed and Sealed this

Third Day of April, 2001

*Attest:*

NICHOLAS P. GODICI

*Attesting Officer*     *Acting Director of the United States Patent and Trademark Office*